United States Patent [19]

Goetze et al.

[11] 4,418,410

[45] Nov. 29, 1983

[54] ERROR DETECTION AND CORRECTION APPARATUS FOR A LOGIC ARRAY

[75] Inventors: Volkmar Goetze, Grafenau; Dieter Schuett, Munich, both of Fed. Rep. of Germany

[73] Assignee: International Business Machines Corporation, Armonk, N.Y.

[21] Appl. No.: 214,313

[22] Filed: Dec. 8, 1980

[30] Foreign Application Priority Data

Dec. 22, 1979 [DE] Fed. Rep. of Germany ....... 2951946

[51] Int. Cl.³ .............................................. G06F 11/00
[52] U.S. Cl. ........................................ 371/15; 371/57
[58] Field of Search ......................... 371/15, 25, 57; 324/73 R; 364/737

[56] References Cited

U.S. PATENT DOCUMENTS

| | | | |
|---|---|---|---|
| 3,958,110 | 5/1976 | Hong et al. ............................ | 371/15 |
| 4,020,460 | 4/1977 | Jones et al. ........................... | 371/57 |
| 4,140,967 | 2/1979 | Balasubramanian et al. .... | 324/73 R |
| 4,225,957 | 9/1980 | Doty, Jr. et al. ...................... | 371/25 |

OTHER PUBLICATIONS

Curlander, "Logic Array Checking" *IBM Tech. Disclosure Bulletin* vol. 18, No. 7, Dec. 1975, pp. 2044–2046.
Cha, "Testing of Programmable Logic Array Cross--Point Defects" *IBM Tech. Disclosure Bulletin* vol. 18, No. 8, Jan. 1976 pp. 2737–2739.
Logue et al "Programmable Logic Array Error Detection and Error Correction" *IBM Tech. Disclosure Bulletin* vol. 19, No. 2, Jul. 1976, pp. 588–590.

*Primary Examiner*—David H. Malzahn
*Attorney, Agent, or Firm*—Saul A. Seinberg

[57] ABSTRACT

Error detection and correction apparatus for a programmable logic array (PLA) having AND and OR logic combinations merged therein is disclosed. The output lines from the AND and OR logic elements are coupled in such a manner that their functions form complete groups containing, if possible, all minterms. Missing minterms are added, as necessary, by special output lines or logic elements provided for that purpose to complete a group. If a minterm occurs on two or more function lines, the corresponding minterm is entered as a correction term into an error detection logic means, one of which is associated with each group of logic output lines. The error detection logic means are also utilized to test whether one, and only one, of the output lines in a grouping of function lines has a binary 1 value.

Error correction signals are generated by mixed group error detection means, the inputs of which are connected to a function line of another function group. If a single error is detected, the error detection logic means for the function line groups indicate which group includes the erroneous function line. The mixed group error detection means similarly indicate, if appropriate, which of function lines of the mixed group is erroneous.

14 Claims, 4 Drawing Figures

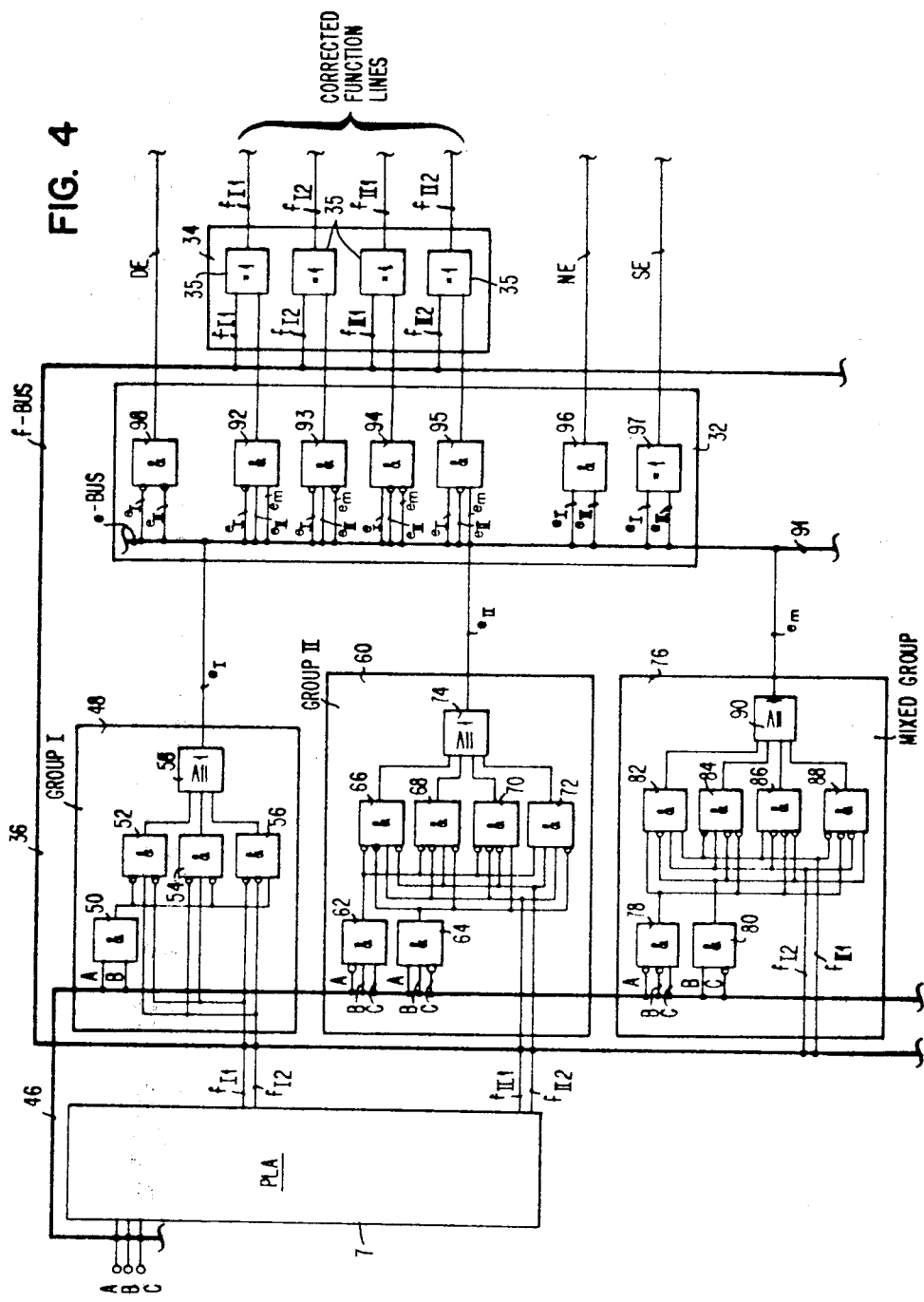

ERROR DETECTION AND CORRECTION APPARATUS FOR A LOGIC ARRAY

BACKGROUND OF THE INVENTION

1. Field of the Invention

This invention is directed to the testing of logic array devices. It concerns, more particularly, error detection and correction apparatus for a logic array which consists of an AND array and an OR array.

2. Description of the Prior Art

Logic array devices of many kinds are well known. If any such device is programmable, it is commonly referred to as a "programmable logic array" or PLA as identified hereinafter. In a typical operation, signals corresponding to a number of binary variables are applied to the input of a PLA and, in accordance with the logic wiring and/or the programmed generation of conductive crosspoints, output signals are obtained on particular function or output lines. PLAs are preferably used as function controls in data processing systems. For this purpose, the binary operation signals of an instruction are applied to the PLA input and the data flow is controlled by means of output signals on particular function lines.

With very few exceptions, known PLAs have the disadvantage that, during their operation in a data processing system, they cannot be tested to insure that they are operating properly. Consequently, to date, PLAs have been tested either prior to their installation in a system or by applying particular test signals and comparing the resultant output signals with known ideal values. Alternatively, one can also interrupt normal system operation and, using special purpose test patterns and diagnostic routines, ascertain the operating soundness of a particular PLA while it is in place.

One prior art approach to this problem is described in U.S. Pat. No. 3,958,110 to Hong et al. In this particular arrangement, logic performing arrays are fabricated to include testing circuitry therewithin. This PLA internal test circuitry eliminates the need for storing information as to the logic functions performed by any particular array and further permits the employment of a uniform testing sequence callable to test all arrays used. Also of possible interest is U.S. Pat. No. 4,140,967 to Balasubramanian et al which describes a testing technique and special testing circuitry for a particular PLA. This technique makes use of the existing bit partitioning input buffer as the source of test patterns and the existing output latches as the storage means for the test response bits of the individually tested components in a merged PLA.

In one special case, a PLA could also be tested using a distinctive personalization as is described in the IBM Technical Disclosure Bulletin, Vol. 18, No. 7, December 1975, at pages 2044 to 2046 thereof. Another special case approach of testing a PLA by checking appropriate voltage values, at the PLA's site and during its operation, is detailed in the IBM Technical Disclosure Bulletin, Vol. 19, No. 2, July 1978, at pages 588 to 590. A final example of the special case approach is described in the IBM Technical Disclosure Bulletin, Vol. 21, No. 5, October 1978, at page 2008. In this arrangement, a PLA is tested by adding special input lines and then utilizing parity signals to verify error-free performance.

All of the foregoing prior art arrangements have the disadvantage that systemic and complete in-situ testing of the logic array, if at all possible, is extremely time consuming. A complete test of the logic array with the aid of test signals requires a great number of signal thruput combinations thereby adding a significant time penalty to the testing procedure. The special cases of testing an installed PLA during its operation, as described above, have the disadvantage that either alternative applications are not tested or that the logic array is only suitable for the actual combinations of input signals applied to the PLA in the test. In addition, such arrangements have the further disadvantage that errors, when they occur, cannot be corrected and the entire system must be shut down.

OBJECTS AND SUMMARY OF THE INVENTION

Accordingly, it is a principal object of the present invention to provide a logic array which can be systematically and completely tested. It is another object of the present invention to insure that a logic array can be fully tested at any point during its operation.

It is also an object of the present invention to effect logic array testing by applying regularly occurring signals to the array during its operation thereby negating the need to interrupt array operation for testing purposes.

It is an additional object of the present invention that all possible combinations of input signals are tested and that the viability of the output function lines of the logic array is also examined.

The foregoing and other objects of the present invention are accomplished by providing error detection and correction apparatus for a binary logic array having AND and OR combinations merged therein. This apparatus includes error detection logic circuit means coupled to those output lines of the array, the totality of whose functions form a group, each group's function lines being coupled for testing by appertaining logic circuit means to determine whether one and only one function line has a binary 1 value and thereafter responsively emitting a binary error signal indicative of the test result. Additional circuit means and groupings are provided to insure that a binary group is made complete by supplying any missing minterms thereto. Further means are included to insure that all valid combinations of input and output lines are tested and that the identify of malfunctioning output lines is revealed.

BRIEF DESCRIPTION OF THE DRAWINGS

A preferred embodiment of the present invention will be described below by way of the accompanying drawings in which:

FIG. 4 illustrates, in greater detail, portions of the apparatus shown in FIG. 3 device.

DESCRIPTION OF THE PREFERRED EMBODIMENT

Figure 1:
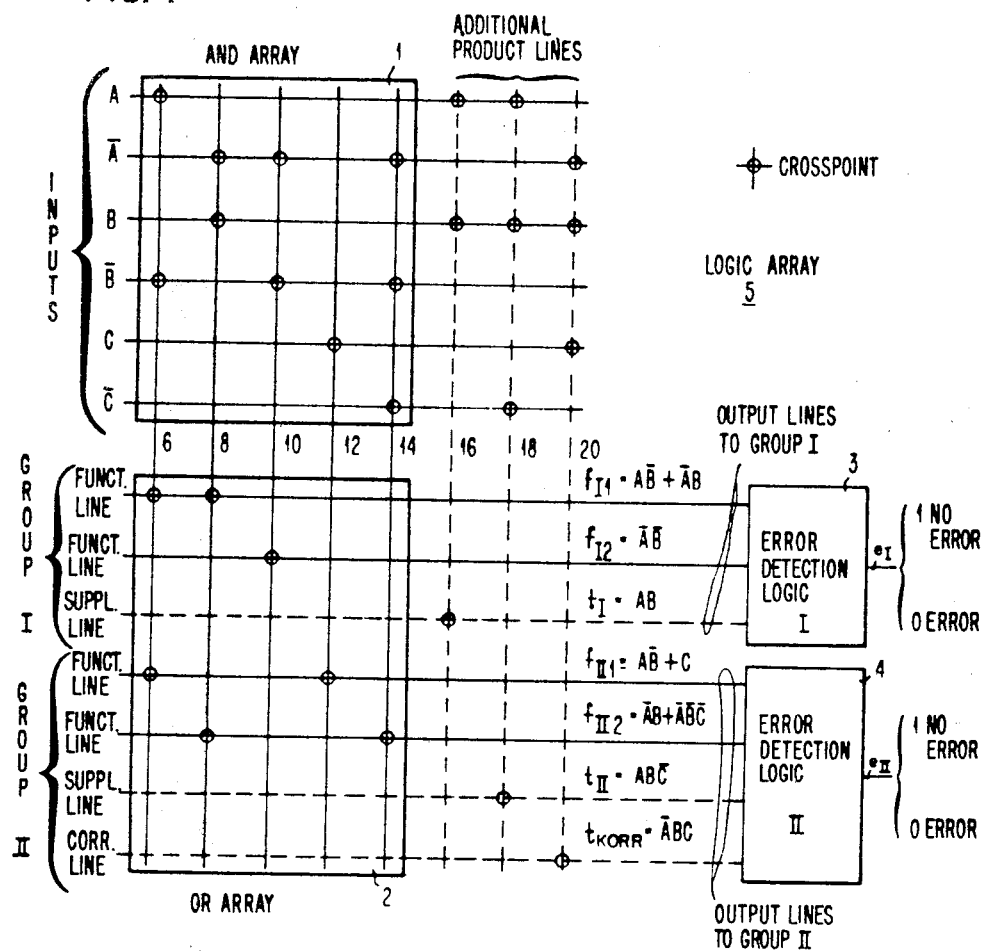
FIG. 1 schematically illustrates a programmable logic array coupled to error detection logic means in accordance with the present invention.

Referring now to the drawings wherein like reference numerals have been used in the several views to identify like elements, FIG. 1 schematically depicts a programmable logic array 5 coupled to error detection apparatus in accordance with the present invention. PLA 5 consists of an AND array 1 and an OR array 2. The lines to the AND matrix 1 form the inputs of PLA 5, whereas the lines from the OR matrix 2 form the outputs. The binary variables to be processed by the logic array are applied to the inputs of the matrix 1. FIG. 1 shows three such variables A, B and C, together with their complements. The output lines of the matrix 1, which simultaneously form the inputs of the matrix 2, are generally referred to as product lines and are designated respectively as 6, 8, 10, 12, and 14 in FIG. 1. The output lines of the PLA are referred to as function lines, FIG. 1 showing four such function lines $f_{I1}$, $f_{I2}$, $f_{II1}$, and $f_{II2}$. The purpose for which the remaining product and output lines are used will be described below.

The PLA 5 may be used, for example, in the function control of a data processing system. For this purpose, the binary operation signals of an instruction are applied to the input of the PLA, thus generating signals on the different output lines, by means of which the data flow is controlled.

In accordance with the present invention, the output lines of PLA 5 are combined in group form in accordance with the laws described below, each group being associated with one error detection logic system. Two such groups, together with the appertaining error detection logic means 3 and 4, are shown in FIG. 1. At the output of each error detection logic means, a signal e is obtained, indicating whether an error exists. For the subsequent embodiment, it is assumed that binary value 1 for signal e indicates that there is no error, while binary value 0 indicates the existence of an error.

In further accord with the present invention, the output lines are combined in such a manner that the groups obtained are as "complete" as possible. A complete group of functions (function lines) is a group whose summed by functions yield the Boolean function 1. Thus, the functions contain all minterms of the binary variables of the group. Group I, shown in FIG. 1, contains two binary variables A and B and, thus, four minterms AB, $\overline{A}$B, A$\overline{B}$, and $\overline{AB}$. Details on binary switching algebra are described, for example, in the book "Modern Switching Theory and Digital Design" by S. C. Lee, Published by Prentice Hall, 1978.

In FIG. 1, the lines of AND array 1 are connected to the columns by suitable crosspoints, the circled intersections of rows and columns, in such a manner that a signal on product line 6 appears when the combination A$\overline{B}$ is present at the PLA input and a signal on product line 8 appears when the combination $\overline{A}$B is present at the PLA input. Via two further OR matrix crosspoints, as shown, the function line $f_{I1}$ is connected to the product lines 6 and 8, so that the function line $f_{I1}$ emits the sum of the two signals or A$\overline{B}$+$\overline{A}$B. Signal $\overline{AB}$ on function line $f_{I2}$ is obtained in a similar manner. At this stage, the two above-mentioned function lines do not yet form a complete group since the minterm AB is still missing. To complete the group, an additional product line 16 and an additional output line referred to as supplementary line $t_I$, are used in accordance with the invention. Thus, the three output lines of the PLA in group I form a complete group and are applied to the error detection logic means 3. For a particular, random combination of the two input variables A and B, a signal must appear on one of the three function lines of group I, if the PLA 5 operates non-erroneously. This signal must appear on one line only, namely, the line associated with the respective minterm applied to the input. Subsequently, the error detection logic means 3 tests whether one and only one function line carries a signal. If this is not the case, the PLA is erroneous. For error indication, the logic means 3 emits a signal $e_I$ which has the value 1 if no error is present and the value 0 if an error is present. Thus, signal $e_I$ can be defined as follows:

$$e_I = f_{I1} \cdot \overline{f_{I2}} \cdot \overline{t_I} + \overline{f_{I1}} \cdot f_{I2} \cdot \overline{t_I} + \overline{f_{I1}} \cdot \overline{f_{I2}} \cdot t_I. \qquad (1)$$

Equation (1) sums up the cases according to which one and only one line of the three lines in group I carries a signal. If none of the three lines carries a 1 signal, equation (1) shows that the error signal $e_I$ becomes zero, thus indicating an error. On the other hand, if two or more lines carry a 1 signal, the binary value for one of the lines may be 1 in one of the three terms summed in equation (1), at least the negated variable for one of the other lines will be 0 in the same term. Thus, none of the three terms can assume the value 1, so that the error signal $e_I = 0$ will occur also in this case.

As shown in FIG. 1, the three output lines of the PLA for group I are connected to different product lines. For the above-mentioned embodiment, it has been assumed that an additional product line 16 is required for adding the minterm AB, which is necessary for supplementing group I. In a number of cases, it will also be possible to use existing product lines for that purpose, if one of them is connected to the two input variables A and B. In such cases, it would only be necessary to add a crosspoint between the corresponding product line and the supplementary line $t_I$. The lines making up a complete group may be associated with three subgroups:

1. function lines of the PLA selected for the corresponding group,
2. supplementary lines which, for adding minterms to the group, are connected to existing product lines, and
3. supplementary lines which, for adding minterms, are connected to additional product lines.

When function lines are combined in the form of a group, it may happen that a particular minterm is contained in two or more function lines. This will hereinafter be referred to as "overlap". In FIG. 1, a signal is obtained on function line $f_{II1}$, if the combination A$\overline{B}$+C is applied to the input. This means that a signal is obtained on that function line, not only in response to the variable C, but also in response to the combinations CAB, C$\overline{A}$B, CA$\overline{B}$, and C$\overline{AB}$. In all of these cases, the input C is connected to said function line via the product line 12 and the crosspoint in function line $f_{II1}$. Similarly, function line $f_{II2}$ not only receives a signal when the combination $\overline{A}$B is present at the input, but also in response to the combinations $\overline{A}$BC and $\overline{ABC}$. As the signal $\overline{A}$B+$\overline{A}$BC is obtained on function line $f_{II2}$, this leads to a signal being obtained both on function line $f_{II1}$ and $f_{II2}$ if the binary combination $\overline{A}$BC is present at the input. Thus, in spite of the fact that the PLA is operating satisfactorily, a signal will be obtained on two output lines, and the error detection logic means 4 will indicate an error ($e_{II} = 0$), although there is no error. To correct the error indication, an additional correction line $t_{korr}$ is provided on which the signal $\overline{A}$BC is obtained. By means of this correction line, the signal $e_{II}$ is caused to assume the value 1 in the manner described hereinafter.

Correction lines need only be provided in the case of overlaps in different function lines. In function line $f_{II1}$, for example, there is an overlap, because for $A\overline{B}$, a signal is also obtained in response to the combinations $A\overline{B}C$ and $A\overline{BC}$. Similarly, a signal is obtained for the term C on function line $f_{II1}$ in response to the above-mentioned combinations. As a result, there is an overlap on this function line with regard to the term $A\overline{BC}$. This overlap does not affect the error detection logic, as it does not infringe the law used by the invention, according to which one and only one function line must carry a signal when a particular input combination is applied.

Overlaps with a supplementary line cannot occur, since otherwise such lines would be superfluous. When testing to determine which of the minterms have already been considered by the two functions $f_{II1}$ and $f_{II2}$, it will be found that minterm $\overline{A}BC$ is outstanding and still has to be added via supplementary line $t_{II}$.

Figure 2:
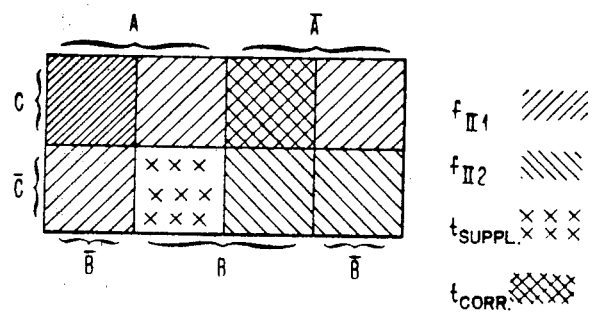
FIG. 2 depicts a Karnaugh map of the FIG. 1 logic array.

By means of FIG. 2 showing a Karnaugh map of the PLA 5, it will be illustrated once more which overlaps are contained in group II of FIG. 1 and which minterms are missing when only the function lines are taken into account. Each of the eight squares shown in FIG. 2 corresponds to one of the eight minterms of the variables A, B and C. The minterms considered by function line $f_{II1}$ are diagonally hatched left to right in FIG. 2, whereas the minterms considered by function line $f_{II2}$ are diagonally hatched right to left in the same drawing. It will be seen that the field corresponding to minterm $A\overline{B}C$ is considered twice by function line $f_{II1}$ (hatched more densely in FIG. 2), which is non-detrimental, as previously pointed out, and that the field corresponding to the minterm $\overline{A}BC$ is considered by both function lines, thus representing the aforementioned overlap. It may also be seen that the field $\overline{A}BC$ is not considered by any of the function lines and thus has to be added to supplement the group.

All sixteen states possible for the four lines $f_{II1}$, $f_{II2}$, $t_{II}$, and $t_{korr}$ and the corresponding error signal $e_{II}$ states therefor are shown in Table 1.

TABLE 1

| Line | $f_{II1}$ | $f_{II2}$ | $t_{II}$ | $t_{korr}$ | $e_{II}$ |
|---|---|---|---|---|---|
| 1 | 0 | 0 | 0 | 0 | 0 |
| 2 | 0 | 0 | 0 | 1 | 0 |
| 3 | 0 | 0 | 1 | 0 | 1 |
| 4 | 0 | 0 | 1 | 1 | 0 |
| 5 | 0 | 1 | 0 | 0 | 1 |
| 6 | 0 | 1 | 0 | 1 | 0 |
| 7 | 0 | 1 | 1 | 0 | 0 |
| 8 | 0 | 1 | 1 | 1 | 0 |
| 9 | 1 | 0 | 0 | 0 | 1 |
| 10 | 1 | 0 | 0 | 1 | 0 |
| 11 | 1 | 0 | 1 | 0 | 0 |
| 12 | 1 | 0 | 1 | 1 | 0 |
| 13 | 1 | 1 | 0 | 0 | 0 |
| 14 | 1 | 1 | 0 | 1 | 1 |
| 15 | 1 | 1 | 1 | 0 | 0 |
| 16 | 1 | 1 | 1 | 1 | 0 |

Logic means 4, associated with group II, must generate an output signal $e_{II}$, i.e., a 1, if there is no error and a 0, if there is an error. In lines 3, 5 and 9 of Table 1, only one of the three output lines carries a signal, so that the output signal $e_{II}$ must be 1. In line 14, both function lines carry a signal indicating that there is an error, unless the double signal on function line $f_{II1}$, as well as function line $f_{II2}$, was caused by the minterm $\overline{A}BC$. In this case, logic means 4 must be prevented from emitting a signal $e_{II}=0$. The necessary correction is effected via correction-line $t_{korr}$.

Taking into account the correction term in the above-mentioned equation (1), the following equation is obtained:

$$e_{II} = f_{II1} \cdot \overline{f_{II2}} \cdot \overline{t_{II}} \cdot \overline{t_{korr}} + \overline{f_{II1}} \cdot f_{II2} \cdot \overline{t_{II}} \cdot \overline{t_{korr}} + \overline{f_{II1}} \cdot \overline{f_{II2}} \cdot t_{II} \cdot \overline{t_{korr}} + f_{II1} \cdot f_{II2} \cdot \overline{t_{II}} \cdot t_{korr} \quad (2)$$

The first three terms in equation (2) correspond to "normal cases", i.e., only one of the three lines $f_{II1}$, $f_{II2}$ or $t_{II}$ carries a signal. The fourth term indicates an overlap. This means that although both function lines $f_{II1}$ and $f_{II2}$ carry a signal, the signal is attributable to the overlap. In such a case, $t_{korr}$ must equal one.

The error case still to be precluded is that where only one function line erroneously carries a signal, i.e., has the binary value 1, if, as a result of an overlap, both function lines have the binary value 1. Such an error must be distinguishable from the normal case where one and only one function line has the value 1. For this purpose, all terms representing normal cases are multiplied by the negation of the correction value, thus ensuring that in the case of an overlap, the error signal e assumes the value 1 only as a result of a complete overlap, i.e., if all function lines affected by the overlap have the value 1.

As may be seen from equations (1) and (2), the error detection logic system formed in this instance by logic means 3 and 4 may consist of a series of AND gates, whose output signals are combined by an OR gate, a summation of the individual terms of the two equations. For each overlapping minterm, the error detection logic must comprise an AND gate whose inputs are connected to the correction line representing the respective overlapping minterm, to the function lines affected by the overlap, and to the supplementary lines.

By way of an example, the error signal e will be described with reference to the following implementation:
1. Five function lines $f_1$ to $f_5$,
2. two supplementary lines $t_1$ $t_2$, and
3. two correction lines, $t_{c1}$ and $t_{c2}$ corresponding to two overlaps, whereby the first overlap is assumed to affect function lines $f_1$, $f_2$ and $f_3$ and the second overlap function lines $f_3$ and $f_4$.

This implementation yields the following error signal equation:

$$\begin{aligned}
e = &f_1 \cdot \overline{f_2} \cdot \overline{f_3} \cdot \overline{f_4} \cdot \overline{f_5} \cdot \overline{t_1} \cdot \overline{t_2} \cdot \overline{t_{c1}} \cdot \overline{t_{c2}} + \\
&+ \overline{f_1} \cdot f_2 \cdot \overline{f_3} \cdot \overline{f_4} \cdot \overline{f_5} \cdot \overline{t_1} \cdot \overline{t_2} \cdot \overline{t_{c1}} \cdot \overline{t_{c2}} + \\
&+ \overline{f_1} \cdot \overline{f_2} \cdot f_3 \cdot \overline{f_4} \cdot \overline{f_5} \cdot \overline{t_1} \cdot \overline{t_2} \cdot \overline{t_{c1}} \cdot \overline{t_{c2}} + \\
&+ \overline{f_1} \cdot \overline{f_2} \cdot \overline{f_3} \cdot f_4 \cdot \overline{f_5} \cdot \overline{t_1} \cdot \overline{t_2} \cdot \overline{t_{c1}} \cdot \overline{t_{c2}} + \\
&+ \overline{f_1} \cdot \overline{f_2} \cdot \overline{f_3} \cdot \overline{f_4} \cdot f_5 \cdot \overline{t_1} \cdot \overline{t_2} \cdot \overline{t_{c1}} \cdot \overline{t_{c2}} + \\
&+ \overline{f_1} \cdot \overline{f_2} \cdot \overline{f_3} \cdot \overline{f_4} \cdot \overline{f_5} \cdot t_1 \cdot \overline{t_2} \cdot \overline{t_{c1}} \cdot \overline{t_{c2}} + \\
&+ \overline{f_1} \cdot \overline{f_2} \cdot \overline{f_3} \cdot \overline{f_4} \cdot \overline{f_5} \cdot \overline{t_1} \cdot t_2 \cdot \overline{t_{c1}} \cdot \overline{t_{c2}} + \\
&+ f_1 \cdot f_2 \cdot f_3 \cdot \overline{f_4} \cdot \overline{f_5} \cdot \overline{t_1} \cdot \overline{t_2} \cdot t_{c1} \cdot \overline{t_{c2}} + \\
&+ \overline{f_1} \cdot \overline{f_2} \cdot f_3 \cdot f_4 \cdot \overline{f_5} \cdot \overline{t_1} \cdot \overline{t_2} \cdot \overline{t_{c1}} \cdot t_{c2}.
\end{aligned} \quad (3)$$

To simplify the error detection logic, several overlap minterms may be combined on one correction line, if possible, provided the respective overlaps concern the same function lines.

In summary, the following results are obtained in accordance with the characteristics of groups I and II as described above:

1. the function lines of the PLA under test are combined in the form of groups in such a manner that the groups thus obtained are as complete as possible, 2. if one or several minterms are missing in the combined group, they are added by means of supplementary lines which are connected, if possible, to existing product lines,
3. alternatively, additional product lines are provided, and
4. for each overlapping minterm, one correction line is provided, by means of which the respective minterm is entered into the error detection logic.

Equations (1) and (2) indicate how the error detection logic system is structured. The output signal e of the error detection logic system assumes the value 1 in the following cases:
1. one and only one function line or supplementary line carries a signal, or
2. several function lines carry a signal, which is attributable to an overlap caused by a minterm being present on several function lines.

Figure 3:
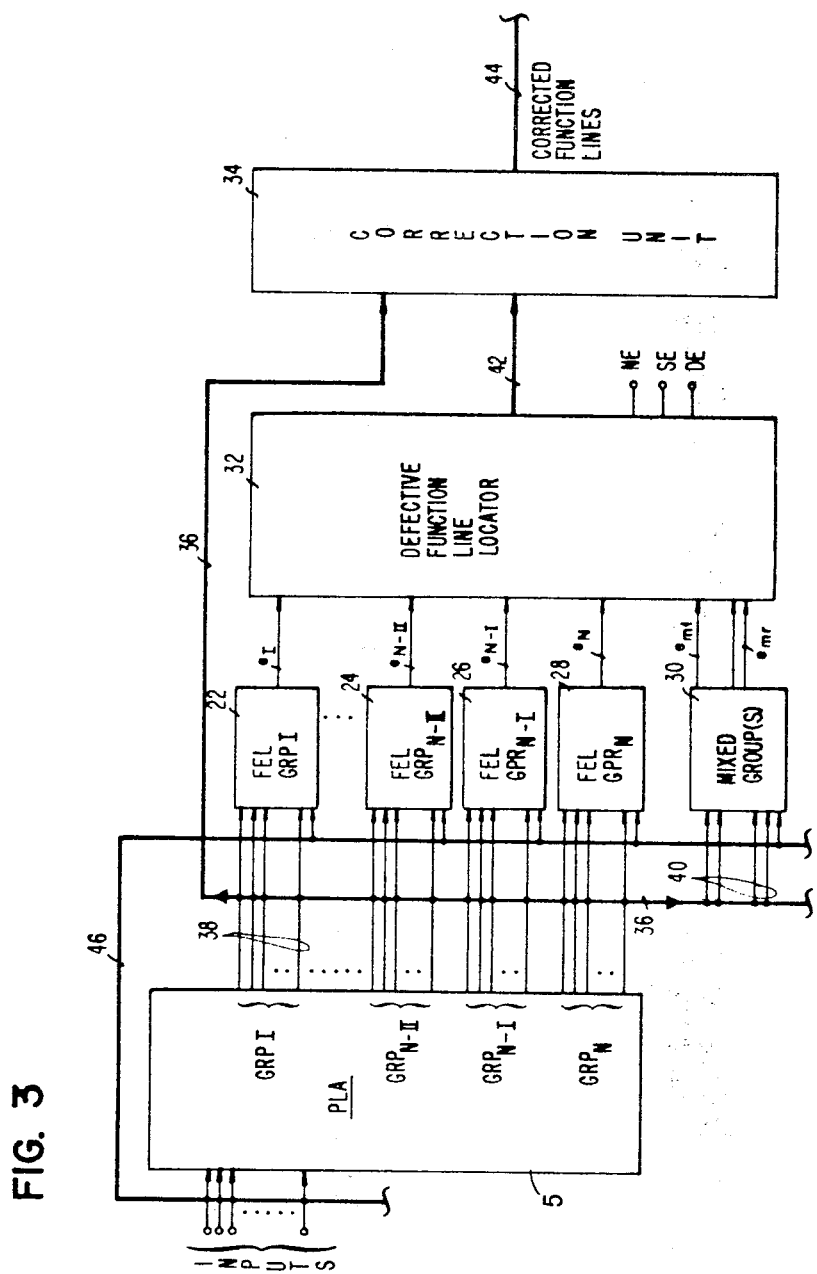
FIG. 3 schematically depicts error detection and correction means implemented in accordance with the present invention.

The complete error detection and correction system in accordance with the invention will be described below by reference to FIG. 3. The left of the figure shows a PLA 5 which is assumed to consist of N groups of function lines. Each of these groups is connected to an error detection logic means FEL. Group I, for example, is connected to the error detection logic means 22 via the output lines 38. The further logic means are designated as 24, 26 and 28. Each logic means supplies an error signal e, whose significance has been described above the means of FIG. 1. Deviating from FIG. 1, each error detection logic means of FIG. 3 is connected to the PLA 5 inputs via a bus 46. As a result, the supplementary and correction terms can be directly formed in the FEL means. FIG. 3 also shows one or several so-called mixed groups 30 which are connected to the output lines of the PLA via lines 40 and bus 36. These mixed groups serve to indicate, by corresponding error signals $e_{m1}$ to $e_{mr}$, which function line is erroneous in a group detected as erroneous by a particular error signal $e_I$ to $e_N$.

For this purpose, the mixed groups are designed analagously to the PLA groups described before, i.e., each mixed group is also complete, with provision, if necessary, for adding supplementary and correction terms as in the case of the PLA groups. In such a case, the number r of the mixed groups would depend on the number of function lines in the PLA group with the highest number of function lines. If one of the error signals e, from systems 22 to 28 is 0, this simultaneously indicates the erroneous function line group of the PLA. Which function line of the group is actually erroneous, is indicated by the corresponding error signal $e_{m1}$ to $e_{mr}$, provided only one error signal with the value 0 is received from the mixed groups. The number of mixed groups can be reduced by one, if the maximum number reduced by one, rather than the maximum number of function lines of the respective PLA group, is used as a standard. If, as a result of error signal $e_I$ to $e_N$, it is known which group is erroneous and the error signals of the mixed groups emit only value 1 signals, i.e., none of the lines to the mixed group is erroneous, then only that line of the aforementioned PLA group can be erroneous which was not connected to the mixed groups. A further saving obtained with mixed group is that not all function lines of the PLA are tested, but only those whose significance is high for the planned application.

The evaluation of the error signals e, i.e., the determination of the erroneous function line, is effected in unit 32, by means of which the correction signals are applied to correction unit 34 via bus 42. In addition, correction unit 34 is connected to the PLA function lines via bus 36, so that in unit 34 the signal on the erroneous function line can be corrected by the corresponding signal on bus 42. Subsequently, corrected signals are obtained at output 44 of the system. Such correction of single errors in PLA output signals, as afforded by the invention, was previously impossible with known arrangements.

The unit 32 for locating the erroneous function line also emits signals indicating that there is no error (NE), that there is a single error (SE) or that there is a double error (DE). As the risk of triple errors and errors of an even higher order is very slight, such errors are neglected for the purpose of the present description. Their presence would be indicated by none of the signals NE, SE or DE occurring.

In the arrangement of FIG. 3, the correction and supplementary terms are generated directly in the logic systems 22 to 28 and in the mixed groups 30 and not in the PLA. This is advantageous in the case of low-capacity PLA's. In addition, the number of PLA output lines is reduced, which, in turn, leads to a smaller number of mixed groups, as may be seen from the preceding description. On the other hand, if the supplementary and the correction terms are externally generated, corresponding logic elements have to be provided in the logic systems 22 to 28 and in the mixed groups 30. This may require a greater amount of space, i.e., a larger chip area, than with internal generation of the terms in the PLA. It would, therefore have to be decided on a case-by-case basis which mode of generating the supplementary and correction terms is more favorable. In the arrangement of FIG. 3, output lines of the PLA are all function lines and the supplementary and correction terms are generated externally. In accordance with this, the mixed groups 30 are only capable of determining which of the function lines is erroneous and not whether a correction or supplementary line is erroneous. As a result, only the function lines in unit 34 can be corrected. In practice, this is not very important, as in the last resort only the output signals on the function lines of the system are used and the supplementary and correction lines are provided only for error detection. In the arrangement shown in FIG. 1, however, the supplementary and correction lines are tested at the same time as the function lines.

The arrangement illustrated in FIG. 3 is shown in greater detail in FIG. 4. For clarity's sake, only two groups of function lines are provided in the drawing, the example illustrated in FIG. 1 will be referred to in connection with the functions obtained on the function lines. In the arrangement of FIG. 4, the supplementary and correction terms are externally generated in the corresponding error detection logic means, as described in connection with FIG. 3. Thus AND gate 50 in the error detection logic means 48 generates the supplementary term $t_I = AB$. In the logic means 60 for group II, AND group 62 generates the correction term $t_{korr} = \overline{ABC}$ and AND gate 64 the supplementary term $t_{II} = A\overline{BC}$. In the logic means 48, the three AND gates 52, 54 and 65 as well as OR gate 58 are provided for generating the error signal $e_I$ in accordance with equation (1). In the error detection logic means 60 of group II, four AND gates 66, 68, 70 and 72 as well as OR gate 74 are provided for generating the error signal $e_{II}$ analogously to equation (2).

FIG. 4 also shows in greater detail, an error detection logic arrangement 76 for a mixed group. As described in connection with FIG. 3, a minimum number of n−1 mixed groups is required for a maximum number of n function lines in a group. As in the example of FIG. 4, if the maximum number of function lines per group is two, only one mixed group is required. Of each group of function lines in the PLA, one function line must be connected to the mixed group, so that in the present case one function line each of the two groups I and II must be connected to the mixed groups. For this purpose, function line $f_{I2}$ of group I and function line $f_{II1}$ of group II have been chosen.

If the two input lines for the mixed group are designated as $f_I$ and $f_{II}$, the following is obtained:

$$f_I = f_{I2} = \overline{AB}, \text{ and} \quad (4)$$

$$f_{II} = f_{II1} = \overline{AB} + C. \quad (5)$$

When the functions corresponding to these two input lines are plotted in a map in accordance with FIG. 2, it will be seen that minterm $B\overline{C}$ is missing and that there is an overlap with regard to minterm $\overline{A}BC$. As the mixed groups, similar to the error detection logic means of the function line groups of the PLA 7, must be complete groups, it will be necessary to generate in logic element 76 the supplementary term $t_m = B\overline{C}$ and the correction term $t_c = \overline{A}BC$. For this purpose, the two AND gates 78 and 80 are provided. Analogously to equation (2), four AND gates 82, 84, 86 and 88 as well as the OR gate 90 are provided for generating the error signal $e_m$.

The error signals $e_I$, $e_{II}$ and $e_m$ are combined on an error bus 91 supplying the input signals to unit 32 for locating the erroneous function line. AND gate 92, for example, generates a 0 signal if function line $f_{I1}$ is erroneous. This is attributable to the fact that both error signals $e_{II}$ and $e_m$ are 1, i.e., the input functions lines for group II and the mixed group are error-free. As, however, an error in group I was detected ($e_I=0$), the erroneous function line can only be function line $f_{I1}$. Analogously, AND gate 93 generates a 1 signal, if the function line $F_{I2}$ is erroneous. This is attributable to the fact that error signal $e_I$ again equals 0, i.e., there is an error in group I, and that, in addition, one of the two input lines of the mixed group is erroneous. Thus, the erroneous function line is function line $f_{I2}$. Analogously, AND gates 94 and 95 indicate which of the two function lines $f_{II1}$ or $f_{II2}$ is erroneous, provided it is certain that there is an error in group II ($e_{II}=0$).

Locating the erroneous function line, as described, yields correct results only in those cases where only one function line is erroneous, i.e., where there is a single error SE. This condition is tested by means of EXCLUSIVE-OR gate 97. Thus, only one of the error signals $e_I$ to $e_N$ must equal 0 (FIG. 3). Of the error signals $e_{m1}$ to $e_{mr}$, not more than one must equal 0. In the case of the arrangement shown in FIG. 4, only one of the two error signals $e_I$ or $e_{II}$ must equal 0. If both error signals equal 0, AND gate 98 indicates a double error DE, and the routine provided for double errors may be initiated. If both error signals equal 1, there is not error (NE), and AND gate 96 generates an output signal.

The functions lines at the output of the PLA 5 are connected to the correction unit 34 of FIG. 3 via bus 36. As shown in FIG. 4, unit 34 may comprise one EXCLUSIVE-OR gate 35 for each function line, the first input of each EXCLUSIVE-OR gate forming the respective function line and the second input the output signal of a corresponding AND gate 92 to 95. If there is no error, all second inputs of the EXCLUSIVE-OR gates equal 0, so that none of the input signals is inverted on the first inputs of the EXCLUSIVE-OR gates. If there is a single error, a 1 signal is applied to the appropriate one of the second inputs of the EXCLUSIVE-OR gates, causing the signal on the associated function line to be inverted. Thus, the corrected function line signals are received at the output of unit 34. The design of the logic means 48, 60 and 76 in FIG. 4 represents only one possible embodiment. Attempts to minimize the number of logic elements, will be made in particular for those applications involving a greater number of inputs for such logic systems. With regard to the structure of the mixed groups, it will have to be decided on a case-by-case basis whether, given a greater number of PLA function line groups and a great number of functions lines in such groups, it may be desirable to replace the parallel structure, as described for mixed groups, by a treelike structure. This also holds true for the unit 32 which pinpoints the erroneous function line, as in this case as well, a far greater number of input signals will have to be decoded as the number of mixed groups increases.

The complete arrangement could be tested further by reapplying the corrected signals obtained at output 44 to the error detection logic means. If the error detection and correction means operates non-erroneously, this will be indicated by the generation of the signal NE ("no error"). An arrangement in accordance with the present invention permits drawing conclusions as to defective crosspoints in a PLA, since with single errors a defective crosspoint in the OR array thereof can, in most cases, be clearly determined. However, it is also possible to track down errors in the AND matrix of the PLA, using input test signals, if necessary.

While the present invention has been described in the context of a preferred embodiment thereof, it will be readily apparent to those skilled in this art that modifications and variations can be made therein without departing from the spirit or scope of the present invention. Accordingly, it is not intended that the present invention be limited to the specifics of the foregoing description of the preferred embodiment. Instead, the present invention should be considered as being limited solely by the appended claims which define its scope.

Having thus described our invention, what we claim as new, and desire to secure by Letters Patent is:

1. Error detection and correction apparatus for testing a binary logic array having at least one AND and one OR logic combination therein and a plurality of output lines, each of which output lines has an available function of said binary logic array present thereon, said apparatus including:
   (a) first circuit means, coupled to said binary logic array, for grouping the output function lines thereof so that each of said groups formed thereby include all possible minterms of the binary variables of that group and that all of the groups jointly include the totality of available binary functions of said binary logic array;
   (b) second circuit means, appropriately coupled to said first circuit means, for testing each of said groups of output function lines to determine whether one and only one function line in each of said groups has a binary value of one; and
   (c) third circuit means, appropriately coupled to said second circuit means, for generating an error signal at its output in response to said test which is indicative of the results thereof.

2. The apparatus according to claim 1 wherein said first circuit means includes fourth circuit means for adding any missing minterms to and thereby completing, if necessary, each of said groups formed by said first circuit means.

3. The apparatus according to claim 2 wherein said fourth circuit includes supplementary output function lines connected to the output of said binary logic array to provide said missing minterms.

4. The apparatus according to claim 1 wherein said first circuit means includes fourth circuit means for adding any missing minterms to and thereby completing, if necessary, each of said groups formed by said first circuit means, said missing minterms being added in such a manner that if an overlap is introduced thereby no error signal will be indicated by said third circuit means even though there will be a binary one signal present on the output function lines of said binary logic array affected by said overlap.

5. The apparatus according to claim 4 wherein said fourth circuit means includes supplementary output function lines connected to the output of said binary logic array to provide said missing minterms.

6. The apparatus according to claim 4 which also includes fifth circuit means, coupled between the output of said binary logic array and said second circuit means, for providing a correction signal path when there are overlaps in different output function lines.

7. The apparatus according to claim 6 which also includes sixth circuit means coupled to the output of said binary logic means, the input of said second circuit means and the input of said fifth circuit means, for generating a signal to be placed on said correction signal path when and only when an overlap would otherwise cause an error signal to be generated by said third circuit means.

8. The apparatus according to claim 7 wherein said fifth circuit means provides one correction signal path for each overlapping minterm.

9. The apparatus according to claim 1 which additionally comprises seventh circuit means, coupled to the output of said binary logic means and the input of said second circuit means, for providing a plurality of mixed groups of output function lines, each of said mixed groups consisting of an output function line from each of said groups regularly formed thereby, said mixed groups including all of the possible minterms of the binary variables of said logic array.

10. The apparatus according to claim 9 wherein said first circuit means includes fourth circuit means for adding any missing minterms to and thereby completing, if necessary, each of said groups formed by said first circuit means, including said mixed groups.

11. The apparatus according to claim 10 wherein said fourth circuit includes supplementary output function lines connected to the output of said binary logic array to provide said missing minterms.

12. The apparatus according to claim 11 wherein said seventh circuit means provides "r−1" mixed groups of output function lines where "r" is equal to the number of function lines in the regularly formed group having the greatest number of output function lines.

13. The apparatus according to claim 9 wherein said seventh circuit means provides "r−1" mixed groups of output function lines where "r" is equal to the number of function lines in the regularly formed group having the greatest number of output function lines.

14. The apparatus according to claim 1 which additionally comprises seventh circuit means, coupled to the output of said binary logic means and the input of said second circuit means, for providing a plurality of mixed groups of output function lines, each of said mixed groups consisting of a treelike structure of output function lines of the groups regularly formed thereby, the arrangement of each of said formed mixed group being a function of the complexity, number of output function lines and number of regularly formed groups thereof of said binary logic array.

* * * * *